US006797601B2

(12) United States Patent
Schuegraf et al.

(10) Patent No.: US 6,797,601 B2
(45) Date of Patent: Sep. 28, 2004

(54) METHODS FOR FORMING WORDLINES, TRANSISTOR GATES, AND CONDUCTIVE INTERCONNECTS

(75) Inventors: Klaus Florian Schuegraf, Fountain Hills, AZ (US); Randhir P. S. Thakur, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/332,271

(22) Filed: Jun. 11, 1999

(65) Prior Publication Data

US 2003/0062566 A1 Apr. 3, 2003

(Under 37 CFR 1.47)

(51) Int. Cl.[7] ................ H01L 21/3205; H01L 21/4763; H01L 21/44; H01L 21/31
(52) U.S. Cl. .............. 438/592; 438/649; 438/663; 438/655; 438/659; 438/763
(58) Field of Search ............... 438/592, 533, 438/649, 655, 659, 644, 663, 763, 532

(56) References Cited

U.S. PATENT DOCUMENTS

| 4,354,309 A | 10/1982 | Gardiner et al. |
| 4,559,091 A | 12/1985 | Allen et al. ............ 148/174 |
| 4,700,215 A | 10/1987 | McPherson |
| 4,833,099 A | 5/1989 | Woo .................... 43/41 |
| 4,886,765 A | 12/1989 | Chen et al. ............ 437/200 |
| 5,047,831 A | 9/1991 | Katayama |
| 5,053,351 A | 10/1991 | Fazan et al. ............ 437/52 |
| 5,093,700 A | 3/1992 | Sakata |
| 5,164,333 A | 11/1992 | Schwalke et al. ........ 437/200 |
| 5,192,708 A | 3/1993 | Beyer et al. ............ 437/90 |
| 5,208,182 A | 5/1993 | Narayan et al. |
| 5,256,894 A | 10/1993 | Shino ................... 257/388 |

(List continued on next page.)

FOREIGN PATENT DOCUMENTS

JP    401276761 A  *  11/1989

OTHER PUBLICATIONS

Ku et al. ;"The application of ion–beam mixing, doped silicide, and rapid thermal processing self–aligned silicide technology", VLSI Technology, Systems and Applications, May 17–19, 1989, pp. 337–341.*

(List continued on next page.)

Primary Examiner—John F. Niebling
Assistant Examiner—Ron Pompey
(74) Attorney, Agent, or Firm—Wells St. John P.S.

(57) ABSTRACT

The invention encompasses stacked semiconductor devices including gate stacks, wordlines, PROMs, conductive interconnecting lines, and methods for forming such structures. In one aspect, the invention includes a method of forming a conductive line comprising: a) forming a polysilicon layer; forming a silicide layer against the polysilicon layer; b) providing a conductivity-enhancing impurity within the silicide layer; and c) providing the polysilicon layer and the silicide layer into a conductive line shape. In another aspect, the invention includes a programmable-read-only-memory device comprising: a) a first dielectric layer over a substrate; b) a floating gate over the first dielectric layer; c) a second dielectric layer over the floating gate; d) a conductive line over the second dielectric layer; and e) a metal-silicide layer over the conductive line, the metal-silicide layer comprising a Group III dopant or a Group V dopant.

17 Claims, 3 Drawing Sheets-

U.S. PATENT DOCUMENTS

| | | | |
|---|---|---|---|
| 5,350,698 A | 9/1994 | Huang et al. ................. 437/26 |
| 5,355,010 A | * 10/1994 | Fujii et al. ................... 257/377 |
| 5,364,803 A | 11/1994 | Lur et al. |
| 5,393,676 A | 2/1995 | Anjum et al. ................. 437/24 |
| 5,393,685 A | 2/1995 | Yoo et al. ..................... 437/44 |
| 5,425,392 A | 6/1995 | Thakur et al. |
| 5,439,833 A | * 8/1995 | Hebert et al. ............... 438/203 |
| 5,441,904 A | 8/1995 | Kim et al. .................... 437/40 |
| 5,472,896 A | 12/1995 | Chen et al. ................... 437/44 |
| 5,481,128 A | 1/1996 | Hong ......................... 257/320 |
| 5,650,648 A | 7/1997 | Kapoor ...................... 257/316 |
| 5,652,156 A | 7/1997 | Liao et al. |
| 5,710,454 A | 1/1998 | Wu ............................ 257/413 |
| 5,712,181 A | 1/1998 | Byun et al. ................... 437/46 |
| 5,723,893 A | 3/1998 | Yu et al. ...................... 257/413 |
| 5,731,239 A | * 3/1998 | Wong et al. ................. 438/296 |
| 5,741,725 A | * 4/1998 | Inoue et al. ................. 438/664 |
| 5,766,994 A | * 6/1998 | Tseng ......................... 438/254 |
| 5,767,004 A | 6/1998 | Balasubramanian et al. |
| 5,767,558 A | 6/1998 | Lo et al. |
| 5,798,296 A | 8/1998 | Fazan et al. ................. 438/592 |
| 5,811,343 A | 9/1998 | Wann et al. ................. 438/305 |
| 5,818,092 A | 10/1998 | Bai et al. ..................... 257/388 |
| 5,837,601 A | * 11/1998 | Matsumoto ................. 438/592 |
| 5,840,607 A | 11/1998 | Yeh et al. |
| 5,851,891 A | * 12/1998 | Dawson et al. ............. 438/305 |
| 5,861,340 A | 1/1999 | Bai et al. |
| 5,877,074 A | 3/1999 | Jeng et al. |
| 5,930,655 A | 7/1999 | Cooney, III et al. |
| 5,985,720 A | 11/1999 | Saitoh ......................... 438/266 |
| 5,986,312 A | 11/1999 | Kuroda ....................... 257/382 |
| 6,040,238 A | 3/2000 | Yang et al. .................. 438/592 |
| 6,060,741 A | 5/2000 | Huang ......................... 257/315 |
| 6,066,577 A | 5/2000 | Cooney, III et al. |
| 6,130,145 A | 10/2000 | Ilg et al. ...................... 438/592 |
| 6,208,004 B1 | 3/2001 | Cuningham ................ 257/413 |
| 6,214,730 B1 | 4/2001 | Cooney, III et al. |
| 6,239,458 B1 | 5/2001 | Liaw et al. .................. 257/296 |
| 6,262,458 B1 | 7/2001 | Hu .............................. 257/384 |
| 6,310,300 B1 | 10/2001 | Cooney, III et al. |

OTHER PUBLICATIONS

Lange, H.; "Physical Properties of Semiconducting Transition Metal Silicides and their Prospects in Si–Based Device Applications"; IEEE 1998; pp. 247–250.*

Mogami et al. ; "Low– Resistance Self–Alighned Ti–Silicide Technology for Sub–Quarter Micron CMOS Devices"; IEEE 1996; pp. 932–939.*

Taishi Kubota et al.; "The Effect of the Floating Gate/Tunnel $SiO_2$ Interface on FLASH Memory Data Retention Reliability"; 1994; 2 pages.

Shoue Jen Wang et al.; "Effects of Poly Depletion on the Estimate of Thin Dielectric Lifetime"; IEEE Electron Device Letters, vol. 12, No. 11, Nov. 1991; pp. 617–619.

Klaus F. Schuegraf et al.; "Impact of Polysilicon Depletion in Thin Oxide MOS Technology"; 1993; pp. 86–88.

E. H. Snow et al.; "Polarizatoin Phenomena and Other Properties of Phosphosilicate Glass Films on Silicon"; Journal of the Electrochemical Society, Mar. 1966; pp. 263–269.

Wolf et al., "Silicon Processing for the VLSI Era—vol. 1: Process Technology," ©1986 Lattice Press, pp. 384–385 (4 pages total).

Ohnishi, K. et al., Improving Gate Oxide Integrity (GOI) of a W/Wnx/dual–poly Si Stacked–Gate by Using Wet–Hydrogen Oxidation in 0.14–µm CMOS devices, IEDM, 1998, pp. 397–400.

Kawada, K. et al., Water Vapor Generator By catalytic Reactor, pp. 10–16.

Wakabayashi, H. et al., An Ultra–Low Resistance and Therma Stable W/pm–Poly–Si Gate CMOS Technology using Si/TiN Buffer Layer, IEDM, 1998, pp. 393–396.

Hiura, Y. et al., Integration Technology of Polymetal (W/WSiN/Poly–Si) Dual Gate CMOS for 1 Gbit DRAMs and Beyond, IEDM, 1998, pp. 389–392.

Nagahama, T. et al., Wet Hydrogen Oxidation System for Metal Gate LSI's, pp. 140–143.

Lee, B. et al., In–situ Barrier Formation for High Reliable W/barrier/poly–Si Gate Using Denudation of $_{wax}$ on Polycrystalline Si, IEDM, 1998 pp. 385389.

* cited by examiner

METHODS FOR FORMING WORDLINES, TRANSISTOR GATES, AND CONDUCTIVE INTERCONNECTS

TECHNICAL FIELD

The invention pertains to a number of semiconductor structures and methods for forming such structures, including gate stack structures, conductive line structures, conductive interconnect structures, and programmable-read-only-memory devices.

BACKGROUND OF THE INVENTION

A continuous challenge in semiconductor processing is to improve conductivity and performance of stacked semiconductor structures. Among the stacked semiconductor structures commonly utilized are gate stacks, wordlines, programmable-read-only-memory devices such as EPROMs and EEPROMs, and conductive interconnects. Formation of some of these prior art stacked structures is described with reference to FIGS. 1-4. FIGS. 1-2 pertain to the formation of a wordline or gate stack structure, and FIGS. 3-4 pertain to the formation of a programmable-read-only memory device.

Referring to FIG. 1, a semiconductor wafer fragment 10 is illustrated at a preliminary processing step of a prior art process for forming a wordline or gate stack. Wafer fragment 10 comprises a semiconductive material substrate 12, and field oxide regions 14 over substrate 12. A gate dielectric layer 16, generally comprising silicon dioxide, extends between field oxide regions 14. A polysilicon layer 18 and a polycide (silicide) layer 20 are formed over field oxide regions 14 and gate dielectric layer 16.

Polysilicon layer 18 typically comprises polysilicon uniformly doped with a conductivity enhancing dopant (illustrated by stippling within layer 18). Polycide layer 20 comprises a metal silicide, such as tungsten silicide, molybdenum silicide, titanium silicide or cobalt silicide. The formation of polycide layer 20 typically comprises depositing a metal over polysilicon layer 18 and reacting the metal with polysilicon layer 18 to form a metal-silicide. The reacting can comprise thermal processing of the metal layer and polysilicon layer at, for example, temperatures of from about 600° C. to about 800° C.

Referring to FIG. 2, layers 16, 18 and 20 are patterned to form a conductive stack, and specifically to form a wordline 24. Source/drain regions 25 are provided proximate wordline 24. Conductive wordline 24 comprises a transistor gate electrically connecting source/drain regions 25. The final transistor structure can be either a p-channel transistor (PMOS), or an n-channel transistor (NMOS), and can be incorporated within a CMOS construction.

The speed of devices comprising wordlines and conductive gates generally increases with increasing conductivities of the wordlines and conductive gates. Accordingly, it would be desirable to improve the conductivity of wordlines and transistor gates. A method for improving the conductivity of a doped layer is to "activate" the dopant within the layer. Although the chemistry of dopant activation is not well understood, activation is thought to occur as dopant is dispersed from grain boundaries in a polysilicon layer to bulk polysilicon away from the grain boundaries. Dopants are typically activated by thermal processing.

Alternative procedures similar to those of FIGS. 1 and 2 can be used to form a conductive polysilicon interconnect. Such interconnects can comprise a line of polycide over a polysilicon. Accordingly, such interconnects are similar to wordline 24, but lack dielectric layer 16.

The speed of devices comprising conductive interconnects can increase with increasing conductivities of the conductive interconnects. Accordingly, it would be desirable to improve the conductivity of conductive interconnects.

Referring to FIGS. 3-4, a prior art process for forming a programmable-read-only memory (PROM) device is illustrated. In the embodiment of FIGS. 3-4, similar numbering to that of the embodiment of FIGS. 1-2 is utilized, with differences indicated by the suffix "a", or by different numbers.

Referring to FIG. 3, a wafer fragment 10a is illustrated at a preliminary step during formation of a programmable-read-only memory device. Wafer fragment 10a comprises a semiconductive material 12a over which is formed field oxide regions 14a and gate dielectric layer 16a. A first polysilicon layer 18a is formed over regions 14a and dielectric layer 16a. A second dielectric layer 26 and a second polysilicon layer 28 are formed over first polysilicon layer 18a, and a polycide layer 30 is formed over second dielectric layer 26.

Polysilicon layers 18a and 28 comprise uniformly doped polysilicon, typically comprising a dopant concentration of greater than $1 \times 10^{19}$ ions/cm$^3$.

Referring to FIG. 4, layers 16a, 18a, 20a, 26, 28 and 30 are patterned to form the resulting PROM device 32. Within device 32, the patterned first polysilicon layer 18a is typically referred to as a floating gate. The patterned second polysilicon layer 28 and polycide layer 30 together comprise a conductive line 33.

The speed of circuits comprising PROM devices can increase with increasing conductivities of the conductive line and floating gate. Accordingly, it would be desirable to improve the conductivities of conductive lines and floating gates.

SUMMARY OF THE INVENTION

The invention encompasses stacked semiconductor devices including gate stacks, wordlines, PROMs, conductive interconnecting lines, and methods for forming such structures.

In one aspect, the invention includes a method of forming a conductive line. A silicide layer is formed against a polysilicon layer. A conductivity-enhancing impurity is provided within the silicide layer. The polysilicon layer and the silicide layer are formed into a conductive line shape.

In another aspect, the invention includes a programmable-read-only-memory device comprising a first dielectric layer over a substrate, a floating gate over the first dielectric layer, a second dielectric layer over the floating gate, a conductive line over the second dielectric layer, and a metal-silicide layer over the conductive line. The metal-silicide layer comprises a Group III dopant or a Group V dopant.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

A first embodiment of the present invention is described with reference to FIGS. 5 and 6. In describing the first embodiment, like numerals from the preceding discussion of the prior art are utilized where appropriate, with differences being indicated by the suffix "b" or with different numerals.

Figure 5:
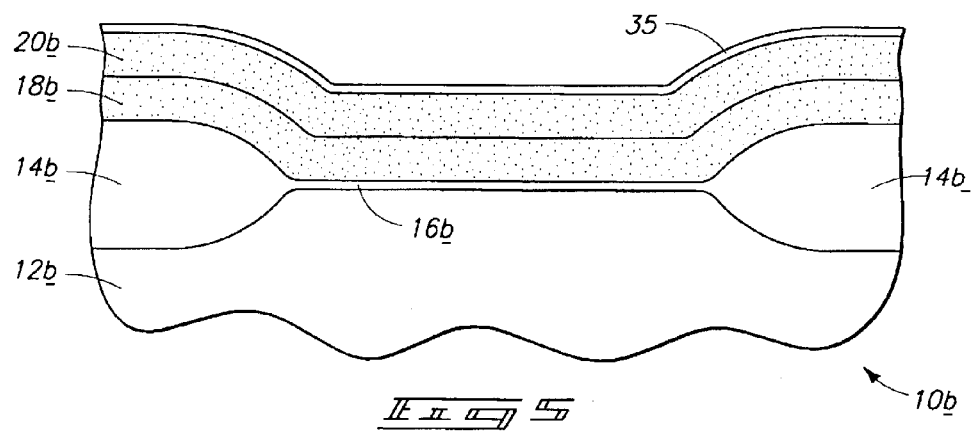
FIG. 5 illustrates a semiconductor wafer fragment at a preliminary step of a first embodiment method of the present invention for forming a wordline.

Referring to FIG. 5, a semiconductor wafer fragment 10b is illustrated at a preliminary processing step. Wafer fragment 10b comprises a semiconductive material substrate 12b, such as, for example, monocrystalline silicon. Field isolation regions 14b and a gate dielectric layer 16b are formed over semiconductive material 12b. Field isolation regions 14b and gate dielectric layer 16b comprise an insulative material, such as, for example, silicon dioxide.

A conductive layer 18b and a polycide layer 20b are formed over field isolation regions 14b and gate dielectric layer 16b. Conductive layer 18b preferably comprises polysilicon doped to a concentration of greater than $1\times10^{19}$ atoms/cm$^3$ with a conductivity enhancing dopant. Polycide layer 20b is against conductive layer 18b and comprises a metal silicide doped with conductivity enhancing dopant (the dopant being indicated by stippling). Preferably, polycide layer 20b is doped to a concentration of greater than $1\times10^{18}$ atom/cm$^3$ with the conductivity enhancing dopant.

Polycide layer 20b can comprise, for example, a metal selected from the group consisting of tungsten, tantalum, titanium, molybdenum and cobalt. Polycide layer 20b can be formed by the prior art method of depositing a metal over polysilicon layer 18b and reacting the metal with polysilicon layer 18b at temperatures of from about 600° C. to about 800° C. to form silicide layer 20b. Alternatively, and preferably, the thermal processing to form polycide layer 20b encompasses rapid thermal processing (RTP). In the context of this document, RTP refers to a process wherein a temperature is ramped at greater than about 7° C./second. Preferably, the RTP temperature is ramped to exceed 850° C. and is maintained above 850° C. for at least 10 seconds. Such RTP can activate dopant within polycide layer 20b to increase the conductivity of doped polycide layer 20b.

The RTP preferably occurs while exposing silicide layer 20b to an oxygen-comprising atmosphere, such as, for example, an atmosphere comprising at least one compound selected from the group consisting of $O_2$, $O_3$, $N_2O$ and NO. Under such preferred conditions, a silicon dioxide layer 35 can be formed over polycide layer 20b. Silicon dioxide layer 35 can impede or prevent dopant diffusion outwardly from layer 20b and thereby advantageously retain dopant within layer 20b. It is noted that while the RTP preferably occurs while exposing layer 20b to an oxidizing atmosphere, the RTP will generally also activate dopant within layer 20b if conducted while exposing layer 20b to a non-oxidizing atmosphere.

Figure 1:
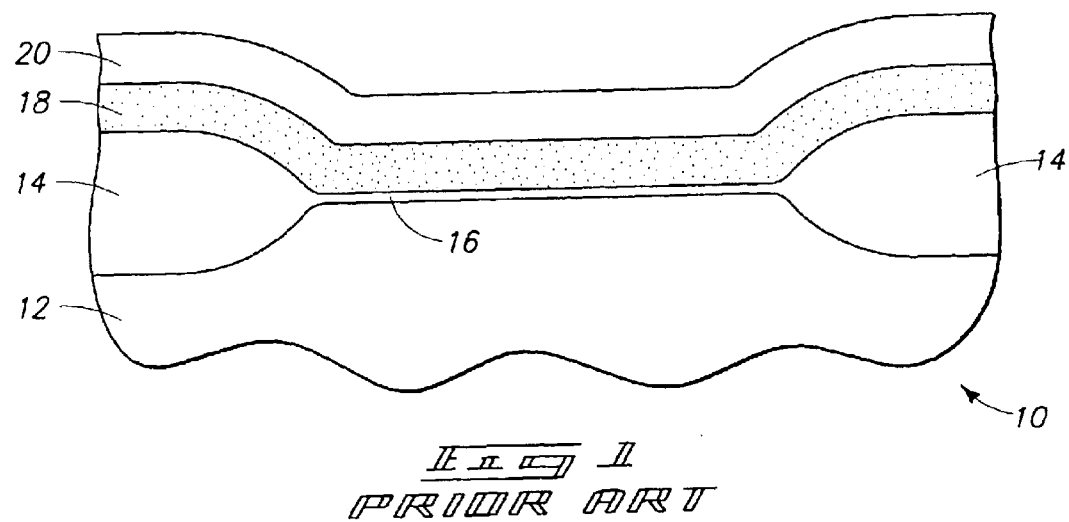
FIG. 1 illustrates a semiconductor wafer fragment at a preliminary step of a prior art method for forming a wordline.
Figure 2:
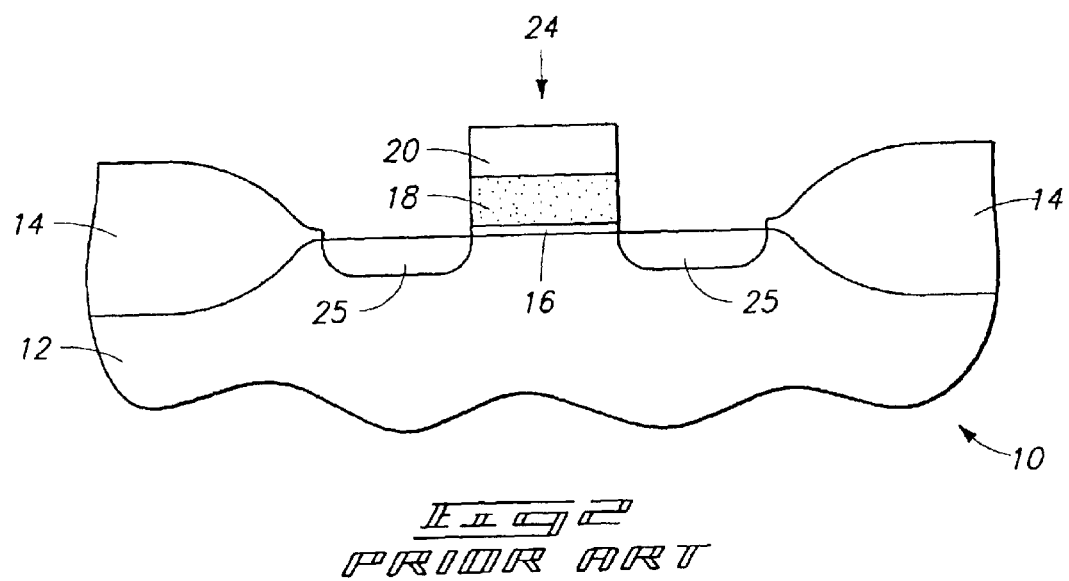
FIG. 2 illustrates the FIG. 1 wafer fragment at a prior art step subsequent to that of FIG. 1.
Figure 3:
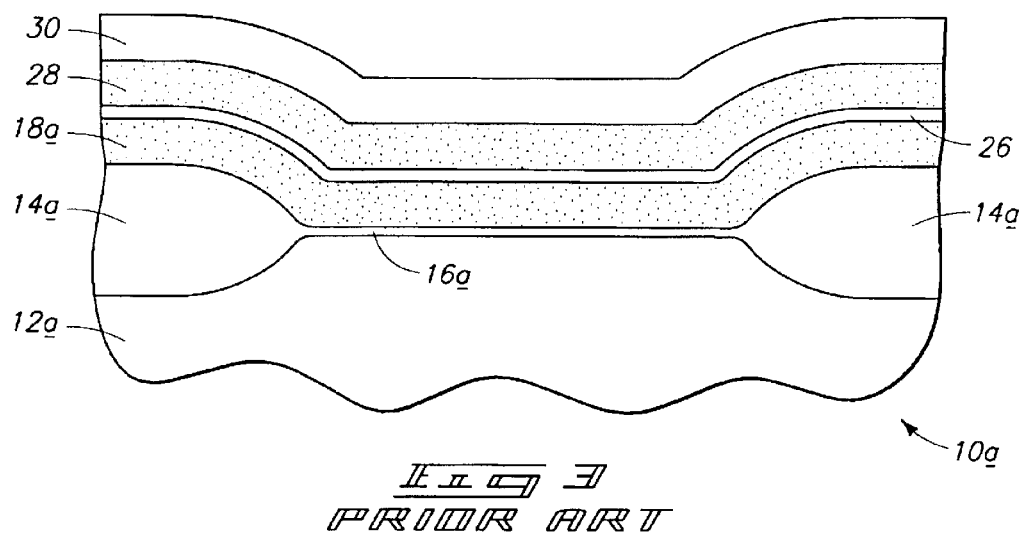
FIG. 3 illustrates a semiconductor wafer fragment at a preliminary step of a prior art method for forming PROM device.
Figure 4:
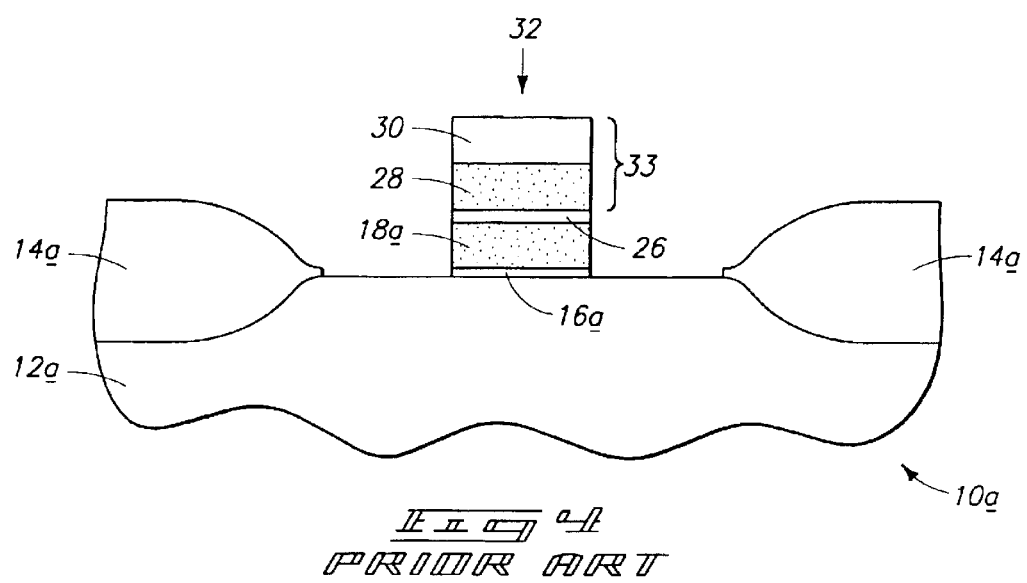
FIG. 4 illustrates the FIG. 3 wafer fragment at a prior art step subsequent to that of FIG. 3.

Wafer 10b differs from wafer 10 of the prior art (shown in FIGS. 1 and 2) in that polycide layer 20b is doped with a conductivity-enhancing impurity, whereas the prior art polycide 20 (shown in FIGS. 1 and 2) is not doped. As indicated above, the conductivity-enhancing dopant is preferably provided to a concentration of greater than $1\times10^{18}$ atom/cm$^3$. Suitable conductivity enhancing dopants can comprise, for example, Group III or Group V dopants, such as dopants comprising boron, phosphorous or arsenic. Methods for doping silicide layer 20b include, for example, implanting dopant into the layer after formation/deposition of the layer, in situ doping of the layer during either chemical vapor deposition (CVD) or sputter deposition, and out-diffusion from a doped polysilicon layer 18b beneath silicide layer 20b.

An example CVD process for forming a polycide layer 20b comprising tungsten silicide doped with phosphorus ($WSi_xP_y$) comprises utilization of $WF_6$, $SiH_4$ and $PH_3$ as precursor materials in a CVD reactor. Alternatively, dichlorosilane can be substituted for $SiH_4$. Also, alternative dopant hydrides can be substituted for $PH_3$ to form a polycide doped with an alternative dopant. Such alternative metal hydrides can include, for example, $AsH_3$ or diborane. Also, other organic precursors comprising Group III or Group V dopants can utilized as alternative sources of dopant.

An example sputter deposition process comprises utilization of a target comprising a mixture of a source of metal, a source of silicon and a source of conductivity-enhancing impurity. The target is sputtered to form a silicide layer 20b comprising the conductivity-enhancing impurity and the metal.

Figure 6:
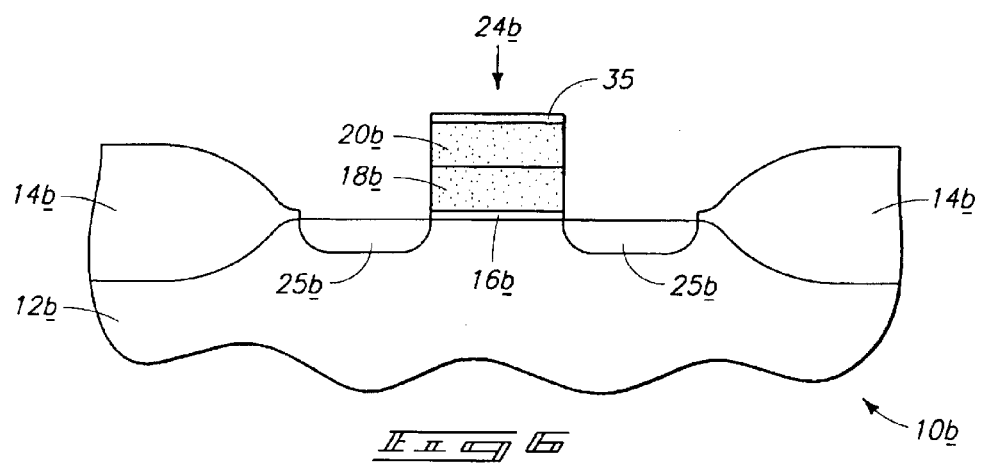
FIG. 6 illustrates the FIG. 5 wafer fragment at a step subsequent to that of FIG. 5.

Referring to FIG. 6, layers 16b, 18b, 20b, and 35 are patterned to form a conductive line 24b. Source/drain regions 25b are formed within substrate 12b such that conductive line 24b comprises a stacked transistor gate structure which electrically connects source/drain regions 25b. The resulting transistor structure can be a PMOS transistor or NMOS transistor, and can be incorporated into a CMOS structure.

Conductive line 24b differs from conductive line 24 (shown in FIG. 2) in that line 24b comprises a silicide layer 20b doped with conductivity-enhancing impurity. Such doping of layer 20b can lower the resistance of layer 20b relative to that of layer 20 (shown in FIG. 1) and thereby improve the performance of conductive line 24b relative to that of conductive line 24 (shown in FIG. 2). The above-discussed RTP can further improve the conductivity of layer 20b by activating dopant within layer 20b.

Although layer 20b is doped prior to patterning of layer 20b to form wordline 24b in the shown method, in alternative embodiments layer 20b can be doped after such patterning. As an example method of accomplishing such alternative embodiments, layer 20b could be doped by ion implanting a conductivity enhancing dopant into layer 20b after patterning of layer 20b to form wordline 24b. As another example method, layer 20b can be doped by out-diffusion from conductively doped layer 18b by thermal treatment of wordline 24b.

The doped silicide of the present invention can be incorporated into numerous circuit device structures, including, for example, programmable-read-only-devices such as EPROMS and EEPROMS.

To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a conductive line comprising:
    forming a silicon-comprising layer, the silicon-comprising layer comprising a dopant therein;
    forming a silicide-comprising layer over the silicon-comprising layer;
    after forming the silicide-comprising layer, out-diffusing dopant from the silicon-comprising layer to the silicide-comprising layer to provide the dopant to within the silicide-comprising layer to a concentration of at least $1 \times 10^{18}$ ions/cm$^3$; and
    after the out-diffusing, etching the silicon-comprising layer and the silicide-comprising layer into a conductive line shape.

2. The method of claim 1 wherein the silicide-comprising layer comprises one or more of tungsten, titanium, molybdenum, and cobalt.

3. The method of claim 1 further comprising, after the out-diffusing, subjecting the silicide-comprising layer to a temperature of over 850° C. for at least 10 seconds.

4. The method of claim 1 further comprising, prior to the etching, forming an oxide layer over the silicide-comprising layer.

5. The method of claim 4 wherein the forming the oxide layer over the silicide-comprising layer further comprises activating the dopant of the silicide-comprising layer.

6. The method of claim 4 wherein the forming the oxide layer comprises subjecting the silicide-comprising layer to a rapid thermal processing step to exceed 850° C. for at least 10 seconds while exposing the silicide-comprising layer to an oxygen-comprising atmosphere.

7. The method claim 4 wherein the out-diffusing occurs after the forming of the oxide layer.

8. The method of claim 1 wherein the conductive line comprises a wordline.

9. A method of forming a conductive line comprising:
    forming a silicon-comprising layer over a semiconductive substrate;
    forming a silicide-comprising layer over the silicon-comprising layer, the silicide-comprising layer having a dopant concentration less than $1 \times 10^{18}$ ions/cm$^3$;
    while the dopant concentration in the silicide-comprising layer is less than $1 \times 10^{18}$ ions/cm$^3$, etching the silicon-comprising layer and the silicide-comprising layer into a conductive line shape; and
    after the etching, providing dopant within the silicide-comprising layer to a concentration greater than $1 \times 10^{18}$ ions/cm$^3$.

10. The method of claim 9 wherein the silicide-comprising layer comprises one or more of tungsten, titanium, molybdenum, and cobalt.

11. The method of claim 9 further comprising, before the etching, providing dopant to the silicon-comprising layer to a concentration of at least about $1 \times 10^{19}$ ions/cm$^3$.

12. The method of claim 9 further comprising forming an oxide layer over the silicide-comprising layer prior to the etching, the silicide-comprising layer and the oxide layer having thickness, wherein the oxide layer thickness is less than one-half of the silicide-comprising layer thickness.

13. The method of claim 12 further comprising, during the forming of the oxide layer, activating the dopant within the silicide-comprising layer.

14. The method of claim 12 wherein the forming the oxide layer comprises subjecting the silicide-comprising layer to a rapid thermal processing step to exceed 850° C. for at least 10 seconds while exposing the silicide-comprising layer to an oxygen-comprising atmosphere.

15. The method of claim 9 further comprising, after the providing the dopant, forming source/drain regions within the semiconductive substrate.

16. The method of claim 9 wherein the providing the dopant comprises gas phase chemical doping of the silicide-comprising layer.

17. The method of claim 9 wherein the conductive line comprises a wordline.

* * * * *

UNITED STATES PATENT AND TRADEMARK OFFICE
CERTIFICATE OF CORRECTION

PATENT NO.   : 6,797,601 B2
DATED        : September 28, 2004
INVENTOR(S)  : Schuegraf et al.

It is certified that error appears in the above-identified patent and that said Letters Patent is hereby corrected as shown below:

Column 3,
Line 42, please delete "atom/cm$^3$" after "$1 \times 10^{18}$" and insert -- atoms/cm$^3$ --.

Column 4,
Line 10, please delete "atom/cm$^3$." before "Suitable" and insert -- atoms/cm$^3$. --.
Line 28, please insert -- be -- after "can".

Signed and Sealed this

Third Day of May, 2005

JON W. DUDAS
*Director of the United States Patent and Trademark Office*